United States Patent
Sugiura (10) Patent No.: US 10,330,761 B2
(45) Date of Patent: Jun. 25, 2019

(54) MAGNETIC RESONANCE IMAGING APPARATUS

(71) Applicant: TOSHIBA MEDICAL SYSTEMS CORPORATION, Otawara-shi, Tochigi (JP)

(72) Inventor: Satoshi Sugiura, Tochigi (JP)

(73) Assignee: TOSHIBA MEDICAL SYSTEMS CORPORATION, Otawara-Shi, Tochigi (JP)

( * ) Notice: Subject to any disclaimer, the term of this patent is extended or adjusted under 35 U.S.C. 154(b) by 143 days.

(21) Appl. No.: 15/378,183

(22) Filed: Dec. 14, 2016

(65) Prior Publication Data
US 2017/0219671 A1    Aug. 3, 2017

(30) Foreign Application Priority Data
Feb. 1, 2016 (JP) .................. 2016-017216

(51) Int. Cl.
*G01R 33/50* (2006.01)
*G01R 33/483* (2006.01)
*G01R 33/563* (2006.01)

(52) U.S. Cl.
CPC ......... *G01R 33/50* (2013.01); *G01R 33/4835* (2013.01); *G01R 33/56308* (2013.01)

(58) Field of Classification Search
CPC ................ G01R 33/50; G01R 33/3835; G01R 33/56308
See application file for complete search history.

(56) References Cited

U.S. PATENT DOCUMENTS

| | | | |
|---|---|---|---|
| 7,443,162 B2 * | 10/2008 | Deimling | G01R 33/4835 324/307 |
| 8,581,583 B2 | 11/2013 | Greiser | |
| 2011/0181285 A1 * | 7/2011 | Greiser | A61B 5/055 324/309 |
| 2012/0232378 A1 | 9/2012 | Messroghli | |
| 2014/0159720 A1 * | 6/2014 | Markl | G01R 33/4835 324/309 |

OTHER PUBLICATIONS

Messroghli et al., "Modified Look-Locker Inversion Recovery (MOLLI) for High-Resolution $T_1$ Mapping of the Heart", *Magnetic Resonance in Medicine*, vol. 52, 2004, pp. 141-146.

* cited by examiner

*Primary Examiner* — Gregory H Curran
(74) *Attorney, Agent, or Firm* — Nixon & Vanderhye P.C.

(57) ABSTRACT

According to one embodiment, a magnetic resonance imaging apparatus includes control circuitry. The control circuitry executes, by a single protocol, acquisition of a distribution of a T1 relaxation time with a first slice as a target, and acquisition of a different kind from the distribution of the T1 relaxation time with a second slice as a target which neither overlaps nor crosses a region of interest of the first slice.

13 Claims, 8 Drawing Sheets

| Imaging No. | Slice No. | |
|---|---|---|
| | T1 map | Cine image |
| 1 | S1 | S6 |
| 2 | S2 | S7 |
| 3 | S3 | S8 |
| 4 | S4 | S9 |
| 5 | S5 | S10 |
| 6 | S6 | S1 |
| 7 | S7 | S2 |
| 8 | S8 | S3 |
| 9 | S9 | S4 |
| 10 | S10 | S5 |

| Imaging No. | Slice No. | | |
| --- | --- | --- | --- |
| | T1 map | First cine image | Second cine image |
| 1 | S1 | S4 | S7 |
| 2 | S2 | S5 | S8 |
| 3 | S3 | S6 | S9 |
| 4 | S4 | S7 | S10 |
| 5 | S5 | S8 | S1 |
| 6 | S6 | S9 | S2 |
| 7 | S7 | S10 | S3 |
| 8 | S8 | S1 | S4 |
| 9 | S9 | S2 | S5 |
| 10 | S10 | S3 | S6 |

MAGNETIC RESONANCE IMAGING APPARATUS

CROSS-REFERENCE TO RELATED APPLICATIONS

This application is based upon and claims the benefit of priority from the prior Japanese Patent Application No. 2016-017216, filed Feb. 1, 2016, the entire contents of which are incorporated herein by reference.

FIELD

Embodiments described herein relate generally to a magnetic resonance imaging apparatus.

BACKGROUND

A magnetic resonance imaging (hereinafter referred to as "MRI") apparatus is an apparatus which acquires chemical and physical microscopic information of a substance by using such a phenomenon that, when a group of target atomic nucleus spins is placed in a magnetic field, the target atomic nucleus spins resonate with a radio frequency magnetic field that rotates at a specific frequency (resonance frequency) corresponding to an inherent magnetic moment of the target atomic nucleus spins and an existing magnetic field intensity, and a signal (magnetic resonance signal) occurs during a relaxation process of the resonated target atomic nucleus spins. In this MRI apparatus, a MOLLI (Modified Look-Locker Inversion Recovery) method is known as a typical method of acquiring a distribution image (T1 map) of T1 values by measuring myocardial T1 (longitudinal relaxation time) values.

In the MOLLI method, one slice is imaged by a Look-Locker method which is synchronized with electrocardiographic waveforms of plural times (typically, three times). In the MOLLI method, in order to secure the precision of T1 measurement, a wait time of plural heartbeats needs to be inserted for sufficiently waiting for recovery of longitudinal magnetization after acquisition in one-time Look-Locker. Thus, since no data can be acquired in the wait time, there is a problem that the efficiency of an examination is not good.

DETAILED DESCRIPTION

In general, according to one embodiment, a magnetic resonance imaging apparatus includes control circuitry. The control circuitry executes, by a single protocol, acquisition of a distribution of a T1 relaxation time with a first slice as a target, and acquisition of a different kind from the distribution of the T1 relaxation time with a second slice as a target which neither overlaps nor crosses a region of interest of the first slice.

Hereinafter, a magnetic resonance imaging apparatus according to an embodiment will be described in detail with reference to the accompanying drawings. In the description below, structural elements having substantially the same function and structure are denoted by like reference numerals, and an overlapping description is given only where necessary.

Figure 1:
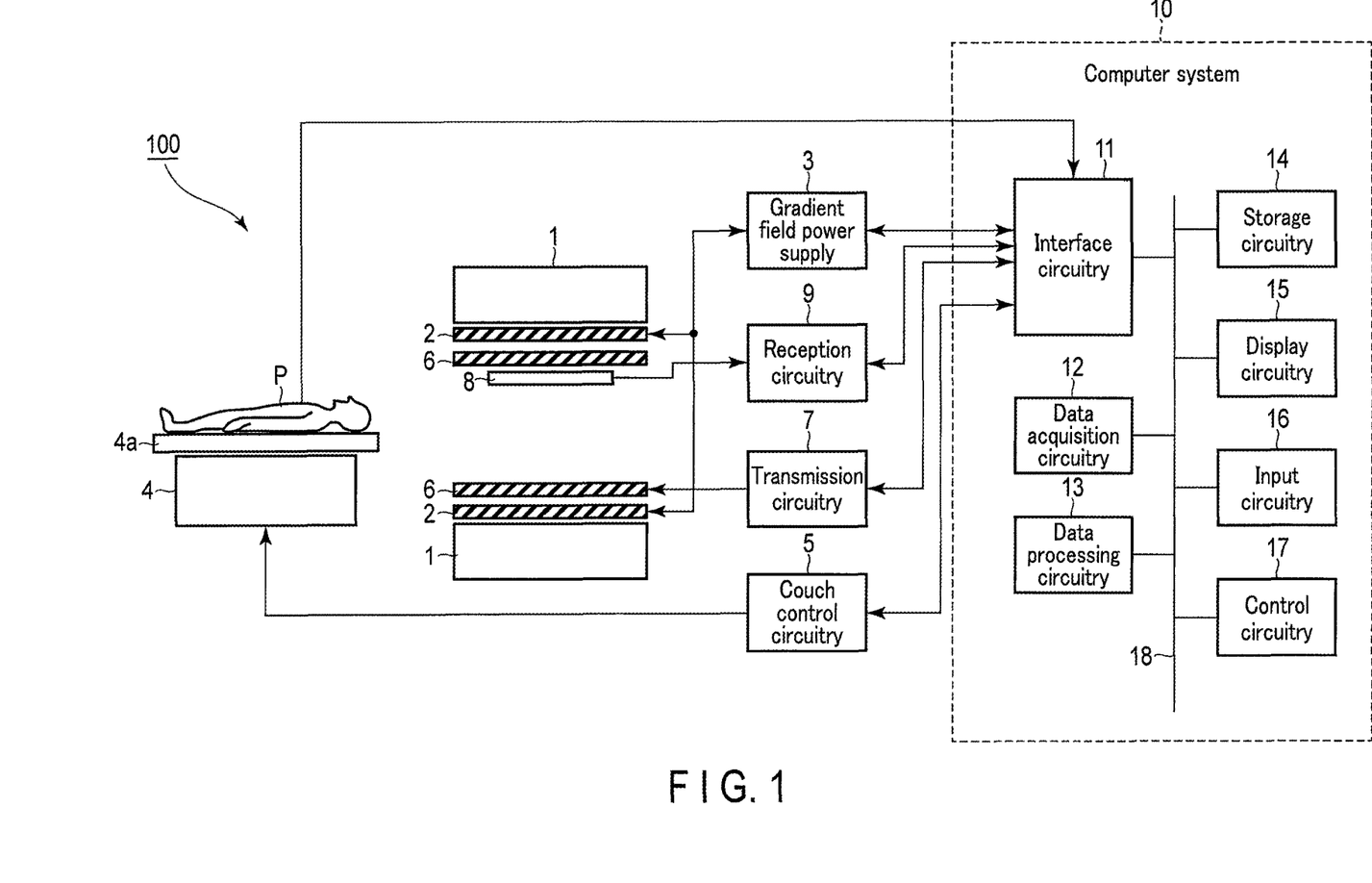
FIG. 1 is a view illustrating an example of the configuration of a magnetic resonance imaging apparatus according to an embodiment.

To begin with, referring to FIG. 1, a description is given of the configuration of a magnetic resonance imaging (hereinafter referred to as "MRI") apparatus according to the embodiment. FIG. 1 is a view illustrating the configuration of an MRI apparatus 100 according the embodiment. As illustrated in FIG. 1, the MRI apparatus 100 includes a static field magnet 1, a gradient field coil 2, a gradient field power supply 3, a couch 4, couch control circuitry 5, a transmission RF coil 6, transmission circuitry 7, a reception RF coil 8, reception circuitry 9, and a computer system 10. Incidentally, a subject P (e.g. a human body) is not included in the magnetic resonance imaging apparatus 100.

The static field magnet 1 is a magnet formed in a hollow cylindrical shape, and generates a uniform static field in the inside space. As the static field magnet 1, for example, a permanent magnet, a superconducting magnet, or the like is used.

In the meantime, a shim coil (not shown) may be formed in a hollow cylindrical shape in the inside of the static field magnet 1. The shim coil is connected to a shim coil power supply (not shown). By power supplied from the shim coil power supply, the shim coil uniformizes the static field which is generated by the static field magnet 1.

The gradient field coil 2 is a coil formed in a hollow cylindrical shape, and is disposed in the inside of the static field magnet 1. The gradient field coil 2 is formed by combining three coils corresponding to X-, Y- and Z-axes which are orthogonal to each other. These three coils individually receive currents from the gradient field power supply 3 (to be described later), and generate gradient fields having field intensities varying along the X-, Y- and Z-axes. Incidentally, the Z-axis direction is identical to the direction of the static field. In addition, the Y-axis direction is a vertical direction, and the X-axis direction is a direction perpendicular to the Z-axis and Y-axis.

Here, the gradient fields of the X-, Y- and Z-axes, which are generated by the gradient field coil 2, correspond to, for example, a slice selection gradient field Gs, a phase encode gradient field Ge, and a readout gradient field Gr. The slice selection gradient field Gs is utilized in order to arbitrarily determine an imaging cross section. The phase encode gradient field Ge is utilized in order to vary the phase of a magnetic resonance signal in accordance with a spatial position. The readout gradient field Gr is utilized in order to vary the frequency of the magnetic resonance signal in accordance with a spatial position.

The gradient field power supply 3 is a device which supplies current to the gradient field coil 2, based on pulse sequence execution data which is sent from the computer system 10.

The couch 4 includes a couch top 4a on which the subject P is placed. Under the control of the couch control circuitry 5 (to be described later), the couch top 4a in a state in which the subject P is placed thereon is inserted into a cavity (imaging port) of the gradient field coil 2. Normally, the couch 4 is disposed such that the longitudinal direction of the couch 4 is parallel to the center axis of the static field magnet 1.

The couch control circuitry 5 is circuitry which controls the couch 4. The couch control circuitry 5 drives the couch 4, and moves the couch top 4a in the longitudinal direction and in the up-and-down direction. The couch control circuitry 5 includes a processor, and corresponds to a couch controller.

The transmission RF (Radio Frequency) coil 6 is a coil disposed in the inside of the gradient field coil 2. The transmission RF coil 6 receives radio frequency pulses which are supplied from the transmission circuitry 7, and generates a radio frequency magnetic field.

The transmission circuitry 7 includes circuitry (processor) which transmits radio frequency pulses corresponding to a Larmor frequency to the transmission RF coil 6, based on pulse sequence execution data which is sent from the computer system 10. The transmission circuitry 7 includes an oscillator, a phase selector, a frequency converter, an amplitude modulator, and a radio frequency power amplifier. The oscillator generates a radio frequency signal of a resonance frequency which is inherent to a target atomic nucleus in the static field. The phase selector selects the phase of the above-described radio frequency signal. The frequency converter converts the frequency of the radio frequency signal which is output from the phase selector. The amplitude modulator modulates the amplitude of the radio frequency signal, which is output from the frequency modulator, for example, in accordance with a sinc function. The radio frequency power amplifier amplifies the radio frequency signal which is output from the amplitude modulator. As a result of the operations of these components, the transmission circuitry 7 transmits radio frequency pulses, which correspond to the Larmor frequency, to the transmission RF coil 6. The transmission circuitry 7 corresponds to a transmitter.

The reception RF coil 8 is a coil disposed in the inside of the gradient field coil 2, and receives a magnetic resonance signal which is emitted from the subject P by the influence of the radio frequency magnetic field. Upon receiving the magnetic resonance signal, the reception RF coil 8 outputs the received magnetic resonance signal to the reception circuitry 9. For example, the reception RF coil 8 is a coil array including one or more coil elements, typically a plurality of coil elements.

The reception circuitry 9 includes a processor which generates magnetic resonance signal data, based on the magnetic resonance signal which is output from the reception RF coil 8, based on the pulse sequence execution data which is sent from the computer system 10. If this reception circuitry 9 generates the magnetic resonance signal data, the reception circuitry 9 transmits the magnetic resonance signal data to the computer system 10.

For example, the reception circuitry 9 subjects the magnetic resonance signal, which is output from the reception RF coil 8, to various signal processes such as pre-amplification, intermediate frequency conversion, phase detection, low-frequency amplification, and filtering. Then, the reception circuitry 9 analog/digital converts the data which was subjected to the various signal processes. Thereby, the reception circuitry 9 generates the magnetic resonance signal data which is digitized complex data. The magnetic resonance signal data, which the reception circuitry 9 generates, is also called "raw data". The reception circuitry 9 corresponds to a receiver.

The computer system 10 executes overall control of the MRI apparatus 100, data acquisition, image reconstruction, etc. The computer system 10 includes interface circuitry 11, data acquisition circuitry 12, data processing circuitry 13, storage circuitry 14, display circuitry 15, input circuitry 16, and control circuitry 17.

The interface circuitry 11 is connected to the gradient field power supply 3, couch control circuitry 5, transmission circuitry 7 and reception circuitry 9. The interface circuitry 11 is a processor which controls the input/output of signals which are transmitted/received between each connected circuitry and the computer system 10. Physiological signal measuring devices (not shown), which are typified by an electrocardiograph, phonocardiograph, sphygmograph and respiratory sensor, an external storage device (not shown) and a network may be connected to the magnetic resonance imaging apparatus 100 via the interface circuitry 11. The interface circuitry 11 inputs an R wave of the electrocardiographic waveform, which is sent from an ECG electrode that is placed on the subject P, to the computer system 10. The interface circuitry 11 corresponds to an interface unit.

The data acquisition circuitry 12 includes a processor which acquires, via the interface circuitry 11, magnetic resonance signal data which is transmitted from the reception circuitry 9. If the data acquisition circuitry 12 acquires the magnetic resonance signal data, the data acquisition circuitry 12 causes the storage circuitry 14 to store the acquired magnetic resonance signal data. The data acquisition circuitry 12 corresponds to a data acquisition unit.

The data processing circuitry 13 includes a processor which subjects the magnetic resonance signal data, which is stored in the storage circuitry 14, to a post-process, that is, a reconstruction process of Fourier transform, etc., and generates spectrum data or image data of desired nucleus spins in the subject P. The data processing circuitry 13 corresponds to a data processor.

Each of the data processing circuitry 13 and data acquisition circuitry 12 includes, as hardware resources, processors such as a CPU (Central Processing Unit), a GPU (Graphics Processing Unit) and an MPU (Micro Processing Unit), and memories such as a ROM (Read Only Memory) and a RAM (Random Access Memory). The data processing circuitry 13 reconstructs an MR image relating to the subject P, based on the magnetic resonance signal data which is output from the reception circuitry 9. For example, the data processing circuitry 13 generates an MR image which is defined by a real space, by applying Fourier transform, etc. to the magnetic resonance signal data that is disposed in a k-space or a frequency space.

The storage circuitry 14 is circuitry which stores, in association with each subject P, magnetic resonance signal data acquired by the data acquisition circuitry 12, and image data generated by the data processing circuitry 13. For example, the storage circuitry 14 is a storage device which is, for example, a RAM, a ROM, a semiconductor memory such as a flash memory, a hard disk drive, a solid state drive, an optical disc, an integrated circuit storage device, etc.

In addition, the storage circuitry 14 may be a drive which reads/writes various information from/to a portable storage medium such as a CD-ROM drive, a DVD drive or a flash memory. For example, the storage circuitry 14 stores MR images, control programs of the magnetic resonance imaging apparatus 100, and a plurality of presets. The preset is a series of imaging protocols, which is pre-registered in accordance with instructions (orders) from a doctor, in connection with an imaging target region and a purpose of imaging before pre-imaging (pre-scan) and main imaging (main scan). The storage circuitry 14 stores an imaging protocol (to be described later) or the like as one of the presets. The storage circuitry 14 corresponds to a storage unit.

The display circuitry 15 is a device which displays various information such as spectrum data or image data, under the control of the control circuitry 17. The display circuitry 15 corresponds to a display unit. Specifically, the display circuitry 15 includes display interface circuitry and a display device. The display interface circuitry converts data, which represents a display target, to a video signal. The display signal is supplied to the display device. The display device displays the video signal which represents the display target. As the display device, for example, use can be made of, as needed, a CRT display, a liquid crystal display, an organic EL display, an LED display, a plasma display, or other arbitrary displays known in the technical field.

In the meantime, the display device may be also provided on, for example, an armor surface of a gantry housing of the MRI apparatus 100, in addition to a console (not shown) in the computer system 10. In this case, an input device, such as pointing device of a pressure-sensitive type, an optical position detection type or an electrostatic type, is provided on the front surface of the display device. For example, a touch panel (video display monitor: also called "touch screen"), in which a display device and a pointing device are integrated, may be provided on the armor surface of the gantry housing on the side of the couch 4.

The input circuitry 16 is circuitry which accepts various operations and information inputs from an operator. Specifically, the input circuitry 16 includes an input device and input interface circuitry. The input device accepts various instructions from the operator. As the input device, use can be made of, as needed, a pointing device such as a mouse or a trackball, a selection device such as a mode change-over switch, or an input device such as a keyboard. The input interface circuitry supplies an output signal from the input device to the control circuitry 17 via a bus. Incidentally, the input circuitry 16 is not limited to circuitry including a physical operational component, such as a mouse or a keyboard. Examples of the input circuitry 16 include such electric signal processing circuitry as to receive an electric signal corresponding to an input operation from an external input device which is provided separately from the MRI apparatus 100, and to output the received electric signal to various circuitry.

The control circuitry 17 includes, as hardware resources, processors such as a CPU and an MPU (not shown), and memories such as a ROM and a RAM, and the control circuitry 17 comprehensively controls the MRI apparatus 100. Specifically, the control circuitry 17 corresponds to a controller which functions as a central unit of the MRI apparatus 100. Specifically, the control circuitry 17 reads out a control program which is stored in the storage circuitry 14, develops the read-out control program on the memory, and controls each circuitry of the MRI apparatus 100 in accordance with the developed control program.

The term "processor" used in the above description means, for example, a CPU, a GPU, or circuitry such as an ASIC (Application Specific Integrated Circuit), or a programmable logic device (e.g. SPLD (Simple Programmable Logic Device), CLPD (Complex Programmable Logic Device), FPGA (Field Programmable Gate Array)).

The processors realize the functions by reading out and executing the programs stored in the storage circuitry 14. In the meantime, instead of storing the programs in the storage circuitry 14, such a configuration may be adopted that the programs are directly incorporated in the circuitry in the processors. In this case, the processors realize the functions by reading out and executing the programs incorporated in the circuitry in the processors. Incidentally, the couch control circuitry 5, transmission circuitry 7, reception circuitry 9, data acquisition circuitry 12 and data processing circuitry 13 are similarly composed of electronic circuitry such as the above-described processors. In the meantime, the various processing functions, which are executed by the data acquisition circuitry 12 and data processing circuitry 13, may be executed by the control circuitry 17.

The above is the description of the entire configuration of the MRI apparatus 100 according to the embodiment. Next, the challenge to be addressed by the embodiment will be described.

In the MRI, an image with high inter-tissue contrast can be obtained by setting a proper acquisition condition by utilizing a difference in relaxation time between tissues. The relaxation is a process in which the macroscopic magnetization of an excited tissue restores to an equilibrium state. Time constants of relaxation are called "longitudinal relaxation time" and "transverse relaxation time" and are expressed by T1 and T2, respectively. A T1 relaxation time, which is also called "spin-lattice relaxation time", is expressed by a time constant in a phenomenon in which longitudinal magnetization restores in a direction of a static field Bo in a process in which an excited spin releases absorbed energy to nearby molecules.

In an examination of the heart, as an imaging method in which the T1 relaxation time is emphasized, there is known a method of observing the state of the cardiac muscle by acquiring a T1 weighted image by an Inversion Recovery method after a predetermined delay time since a contrast medium was injected (this method is called "Late Gadolinium Enhancement", "Late Enhancement", "Delayed Enhancement", etc.). This method is a standard method of local characterization of the cardiac muscle.

This method is not a quantitative method. Thus, a normal cardiac muscle and a defective cardiac muscle can be distinguished, but there is difficulty, in some cases, in diagnosing a diffuse disease or slight fibrosis. On the other hand, if pixel-by-pixel T1 values can be measured and visualized into an image, quantitative diagnosis is enabled. It is expected that more exact diagnosis information will be given by quantitative diagnosis.

In the MR image, an image, into which measured pixel-by-pixel T1 values are visualized, is hereinafter referred to as "T1 map". However, a conventional T1 map imaging method, which requires a plurality of number of times of imaging with a TI (Inversion Time) being changed, is difficult to apply to a cardiac muscle with heartbeats and movement due to respiration. In recent years, a MOLLI (Modified Look-Locker Inversion Recovery) method has been proposed as a method of making an image of T1 values of the cardiac muscle.

The MOLLI method is based on the Inversion Recovery method in which magnetization in a steady state is inverted by a non-slice-selective 180° pulse. In the MOLLI method, signal acquisition and imaging are executed from 1 slice, successively over a plurality of heartbeats in the course of occurrence of T1 relaxation (recovery of longitudinal magnetization), and pixel-by-pixel T1 values are calculated to create a T1 map. The advantage of the MOLLI method is that all data, which is necessary for T1 measurement of 1 slice can be acquired within the time of a single breadth-hold.

However, in the MOLLI method, in order to secure the precision of T1 measurement, the Look-Locker method is repeated a plurality of times (typically three times). Thus, a wait time of plural heartbeats needs to be inserted for waiting for recovery of longitudinal magnetization after acquisition of magnetic resonance signal data by one-time Look-Locker. Thus, since no magnetic resonance signal data can be acquired during the period corresponding to the wait time, there is a problem that the efficiency of an examination is not good.

Additionally, in the MOLLI method, in order to obtain a T1 map of the entirety of the heart, breath-hold needs to be repeated a plural number of times, which corresponds to the number of necessary slices. In general, in an MR examination of the heart of the subject P, a plurality of kinds of imaging are often performed for providing information relating to the myocardial wall motion, blood flow, and myocardial perfusion, aside from images representing the relaxation time, and diagnosis is conducted by combining a plurality of pieces of information. In particular, cine imaging for observing the myocardial wall motion is one of basic imagings, and, in usual cases, the cine imaging is incorporated in the MR cardiac examination.

Taking the above circumstance into account, in the present embodiment, a wait time after relaxation time measurement, during which no data acquisition is normally performed in the MOLLI method, is effectively utilized. Thereby, the embodiment aims at shortening the total time of the cardiac examination, and reducing the load on the patient who holds breadth.

Figure 2:
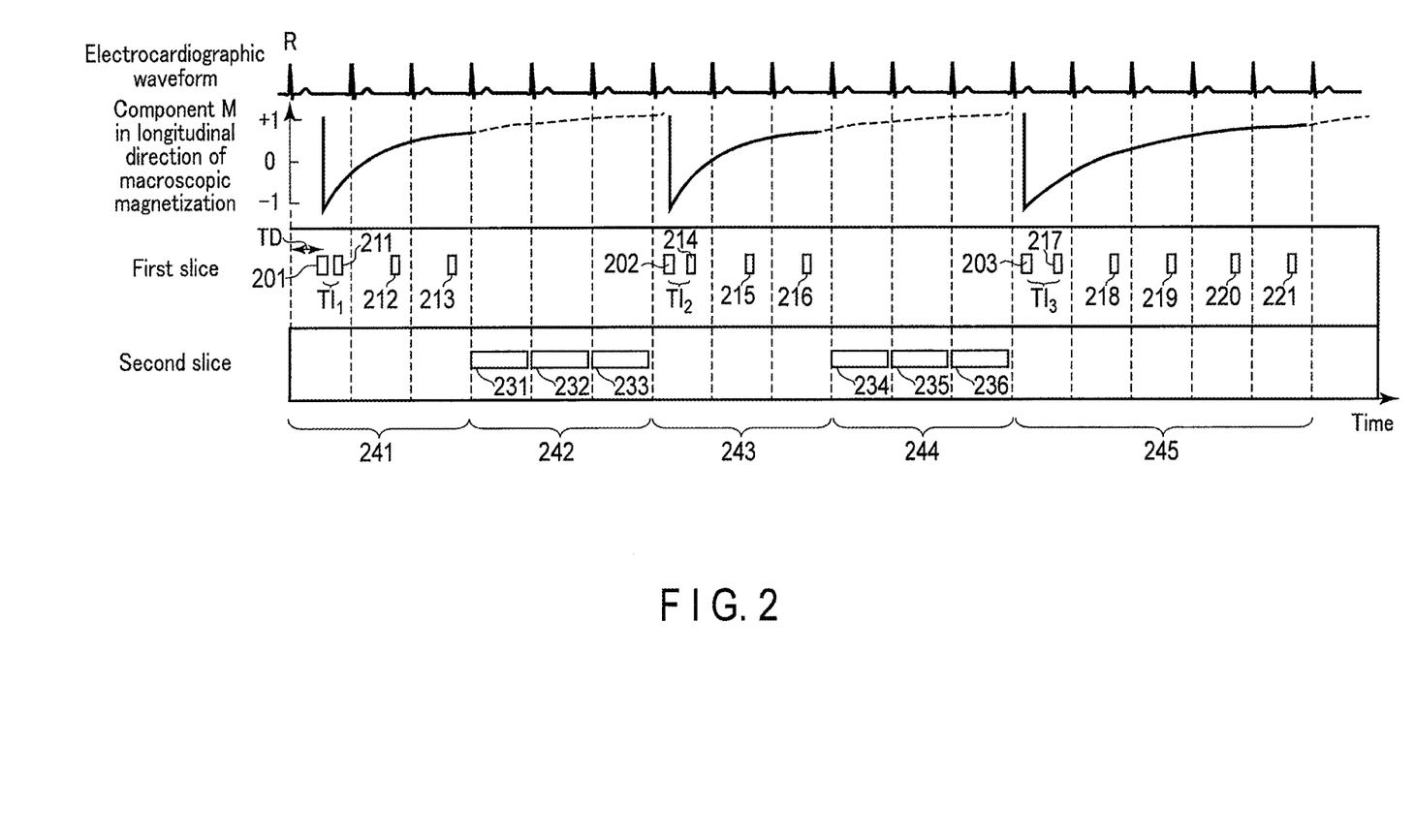
FIG. 2 is a view illustrating an example of an imaging protocol according to the embodiment.

Next, referring to FIG. 2, a description is given of a plurality of imaging sequences which are executed by a single protocol (hereinafter referred to as "imaging protocol") in the present embodiment. FIG. 2 is a view illustrating an example of the imaging protocol. As illustrated in FIG. 2, the imaging protocol is a single protocol which executes acquisition (hereinafter referred to as "first acquisition") of a distribution of a T1 relaxation time with a first slice as a target, and acquisition (hereinafter "second acquisition") which is different in kind from the distribution of the T1 relaxation time. The target of the second acquisition is a second slice which neither overlaps nor crosses a region of interest of the first slice.

Here, the imaging protocol is information (pulse sequence execution data) which is necessary for operating the gradient field power supply 3, transmission circuitry 7, etc. in accordance with a series of pulse sequences. Specifically, the imaging protocol includes a plurality of imaging parameters which are preset in according with, for example, an imaging sequence, an imaging target region, a purpose of imaging, etc. For example, the imaging protocol is defined by set values of plural imaging parameters. The imaging parameters are, for example, information relating to the intensity, application time and application timing of a pulse current that is applied to the transmission RF coil 6. In other words, the imaging protocol corresponds to an imaging sequence having imaging parameters which are set in accordance with an imaging target region, a purpose of imaging, an image contract, a resolution, etc. The imaging target region in this embodiment is, for example, the heart.

The imaging protocol according to the present embodiment includes a first imaging sequence corresponding to the first acquisition, and a second imaging sequence corresponding to the second acquisition. The first imaging sequence is an imaging sequence relating to the MOLLI method. The second imaging sequence will be described later.

The storage circuitry 14 stores the single imaging protocol as illustrated in FIG. 2. The input circuitry 16 inputs, by the operator's instruction, a start instruction of execution of this imaging protocol (hereinafter referred to as "imaging execution instruction"). Triggered by the input of the imaging execution instruction, the control circuitry 17 reads out the imaging protocol from the storage circuitry 14. By executing the read-out imaging protocol, the control circuitry 17 operates the gradient field power supply 3, transmission circuitry 7, etc.

Specifically, if the imaging based on this imaging protocol is started, the control circuitry 17 waits until an R wave of an electrocardiographic waveform, which is sent from the ECG electrode that is placed on the subject P, is input, according to the first imaging sequence. After a predetermined delay time TD from the detection of the R wave, the control circuitry 17 applies a non-space-selective first IR (Inversion Recovery) pulse 201 to the transmission RF coil 6. By the application of the first IR pulse 201 to the transmission RF coil 6, the magnetization in the tissue in the subject P, which is substantially abutted on the transmission RF coil 6, is inverted by about 180°.

In FIG. 2, a component in a longitudinal (static field) direction of macroscopic magnetization is expressed by M. Here, the reason why the IR pulse is set to be non-space-selective is that the heart moves by heartbeat movement during the period from the IR pulse to the data acquisition and, thus, if the IR pulse is set to be slice-selective, a positional displacement would occur between a cross section, which received the IR pulse, and a cross section on which data acquisition is executed, and a correct contrast could not be obtained.

The inverted magnetization recovers at a longitudinal relaxation time T1 of the tissue. After a time indicated by an inversion time $TI_1$ in FIG. 2 from the first IR pulse 201, the control circuitry 17 executes data acquisition (hereinafter referred to as "T1 measurement first acquisition") 211 for T1 measurement from the first slice. The control circuitry 17 executes, as the T1 measurement first acquisition 211, for example, a balanced steady-state free precession (SSFP) type (also called "True FISP") sequence. At this time, the data acquisition circuitry 12 acquires all phase encode lines that are necessary for image reconstruction of one slice (first slice) image, during the data acquisition period of the T1 measurement first acquisition 211.

The number of phase encode lines (hereinafter referred to as "phase encode number") can be reduced by a combination with a reconstruction method utilizing parallel imaging or complex conjugate of data. In the imaging protocol, the delay time TD is set such that the T1 measurement first acquisition 211 coincides with a specific time phase in the cardiac cycle, preferably a diastolic phase at which the movement of the heart is small.

According to the imaging protocol, the control circuitry 17 executes a T1 measurement second acquisition 212 and a T1 measurement third acquisition 213 during the next heartbeat period and the heartbeat period after the next, in the course of T1 relaxation. The control circuitry 17 executes, as the T1 measurement second acquisition 212 and T1 measurement third acquisition 213, balanced steady-state free precession (SSFP) type sequences with respect to the first slice that is the same as the slice relating to the T1 measurement first acquisition 211. Thereby, the data acquisition circuitry 12 acquires signals obtained by the balanced SSFP type sequence in the T1 measurement second acquisition 212 and T1 measurement third acquisition 213.

Specifically, the control circuitry 17 executes the T1 measurement second acquisition 212 and T1 measurement third acquisition 213 at the same timing of the cardiac phase as the timing of the cardiac phase relating to the T1 measurement first acquisition 211. Thereby, the data acquisition circuitry 12 acquires all encode lines that are necessary for image reconstruction of one slice (first slice), also in the T1 measurement second acquisition 212 and T1 measurement third acquisition 213. At this time, if the cardiac cycle of the subject P is RR, the start timings (TI) of the T1 measurement first acquisition 211, T1 measurement second acquisition 212 and T1 measurement third acquisition 213 are, respectively, $TI=TI_1$, $TI=TI_1+RR$, and $TI=TI_1+2\times RR$.

Image data corresponding to $TI=TI_1$, $TI=TI_1+RR$, and $TI=TI_1+2\times RR$ are obtained by the T1 measurement first acquisition 211, T1 measurement second acquisition 212 and T1 measurement third acquisition 213, respectively. Specifically, the data acquisition circuitry 12 acquires data of three points that are necessary for T1 measurement, during a period (hereinafter referred to as "first T1 measurement period") indicated by 241 in FIG. 2 which extends over three heartbeats.

In order to enhance the precision of T1 measurement, that is, the precision of the T1 map, it is necessary to increase the number of points of measurement. Thus, during a period (hereinafter referred to as "second T1 measurement period 243") indicated by 243 in FIG. 2 which extends over three heartbeats, the control circuitry 17 executes additional Look-Locker measurement in which the inversion time TI is displaced from the inversion time $TI_1$ in the first T1 measurement period 241. At this time, in order to execute exact measurement, it is necessary to make the Look-Locker measurement stand by over a predetermined heartbeat period (e.g. a period 242 and a period 244 each extending over three heartbeats, as illustrated in FIG. 2) until the inverted magnetization sufficiently recovers.

For example, if the T1 value of the normal cardiac muscle at a static field intensity of 1.5 T is about 1,000 msec, the longitudinal magnetization recovers up to about 96.3% of the equilibrium state, with a wait time of 4,000 msec that is four times greater than this T1 value. Further, the longitudinal magnetization recovers up to about 98.7% of the equilibrium state, with a wait time of 5,000 msec. It follows from this that, although depending on the heart rate of the subject P, the recovery of longitudinal magnetization requires a recovery period (hereinafter referred to as "longitudinal magnetization recovery period") of T1 relaxation extending over about three heartbeats, after one-time Look-Locker measurement (first T1 measurement period 241 and second T1 measurement period 243).

In FIG. 2, the longitudinal magnetization recovery period is represented by the first longitudinal magnetization recovery period 242 after the first T1 measurement period 241 and by the second longitudinal magnetization recovery period 244 after the second T1 measurement period 243. Incidentally, the longitudinal magnetization recovery period is not limited to the three heartbeats, and may be, for example, an arbitrary plural number of heartbeats.

In the normal T1 measurement method, in the longitudinal magnetization recovery period, it is necessary to avoid disturbing recovery of magnetization by applying an IR pulse or an excitation pulse for data acquisition to the slice (first slice) to be measured. On the other hand, in the imaging protocol in this embodiment, as illustrated in FIG. 2, the control circuitry 17 executes, in the first longitudinal magnetization recovery period 242, three-time data acquisitions (hereinafter referred to as "cine first acquisition 231", "cine second acquisition 232" and "cine third acquisition 233") with respect to a second slice that is different from the first slice, with respect to which the data of T1 measurement is acquired, and that is parallel to the first slice.

The control circuitry 17 executes, as the cine first acquisition 231, cine second acquisition 232 and cine third acquisition 233, data acquisition by a two-dimensional single slice multi-phase method in which a two-dimensional k-space is divided into a plurality of segments. At this time, the control circuitry 17 executes, for example, a balanced steady-state free precession (SSFP) type sequence, as read-out in the second imaging sequence.

Thereby, in the present embodiment, the data acquisition circuitry 12 acquires half the amount of data that is necessary for reconstructing a multi-phase image (cine image) of the second slice, that is, data which occupies half the k-space corresponding to the multi-phase image, during the period of three heartbeats corresponding to the first longitudinal magnetization recovery period 242.

At this time, the second slice is a cross section which neither overlaps nor crosses a region of interest of the first slice. Specifically, the second slice is a slice which does not influence the recovery of T1 relaxation in the first slice, that is, a slice which is non-influential on the recovery of T1 relaxation. Incidentally, the second slice may be a cross section which does not overlap, and is parallel to, a region of interest of the first slice. Thus, by the execution of data acquisition relating to the cine image corresponding to the second slice, the T1 relaxation in the first slice is not disturbed, and the data acquisition relating to the cine image, that is, the second imaging sequence does not affect the precision of T1 measurement.

After executing the second imaging sequence in the longitudinal magnetization recovery period 242, the control circuitry 17 executes second Look-Locker measurement with respect to the first slice in the second T1 measurement period 243. In the first time phase (heartbeat) in the second T1 measurement period 243, a delay time TI from a second IR pulse 202 is set to be $TI_2$ that is longer than $TI_1$. In addition, the start timings of data acquisition in T1 measurement fourth acquisition 214, T1 measurement fifth acquisition 215 and T1 measurement sixth acquisition 216 with reference to the second IR pulse 202 are, respectively, TI=TI$_2$, TI=TI$_2$+RR, and TI=TI$_2$+2×RR, like the start timings of data acquisition in the T1 measurement first acquisition 211, T1 measurement second acquisition 212 and T1 measurement third acquisition 213 with reference to the first IR pulse 201. By the T1 measurement fourth acquisition 214, T1 measurement fifth acquisition 215 and T1 measurement sixth acquisition 216, image data of three points corresponding to TI=TI$_2$, TI=TI$_2$+RR, and TI=TI$_2$+2×RR is obtained.

In the second longitudinal magnetization recovery period 244 following the second T1 measurement period 243, the control circuitry 17 re-acquires data for the other half of the k-space corresponding to the multi-phase image, which relates to the single slice multi-phase of the second slice.

In a third T1 measurement period 245 following the second longitudinal magnetization recovery period 244, the control circuitry 17 executes third Look-Locker measurement with respect to the first slice. In the first time phase (heartbeat) in the third T1 measurement period 245, a delay time TI from a third IR pulse 203 is set to be TI3 that is still longer than TI$_2$.

The start timings TI of data acquisition in T1 measurement seventh acquisition 217, T1 measurement eighth acquisition 218, T1 measurement ninth acquisition 219, T1 measurement tenth acquisition 220 and T1 measurement eleventh acquisition 221 are, respectively, TI=TI$_3$, TI=TI$_3$+RR, TI=TI$_{3+2}$×RR, TI=TI$_3$+3×RR, and TI=TI$_3$+4×RR, like the start timings of data acquisition in the T1 measurement first acquisition 211, T1 measurement second acquisition 212 and T1 measurement third acquisition 213 with reference to the first IR pulse 201, and like the start timings of data acquisition in T1 measurement fourth acquisition 214, T1 measurement fifth acquisition 215 and T1 measurement sixth acquisition 216 with reference to the second IR pulse 202.

By the T1 measurement seventh acquisition 217, T1 measurement eighth acquisition 218, T1 measurement ninth acquisition 219, T1 measurement tenth acquisition 220 and T1 measurement eleventh acquisition 221, image data in the T1 relaxation process of five points corresponding to TI=TI$_3$, TI=TI$_3$+RR, TI=TI$_3$+2×RR, TI=TI$_3$+3×RR, and TI=TI$_3$+4×RR is obtained. As described above, by the first T1 measurement period 241, second T1 measurement period 243 and third T1 measurement period 245, the data acquisition circuitry 12 obtains eleven measurement points in total with respect to the T1 relaxation process.

Figure 3:
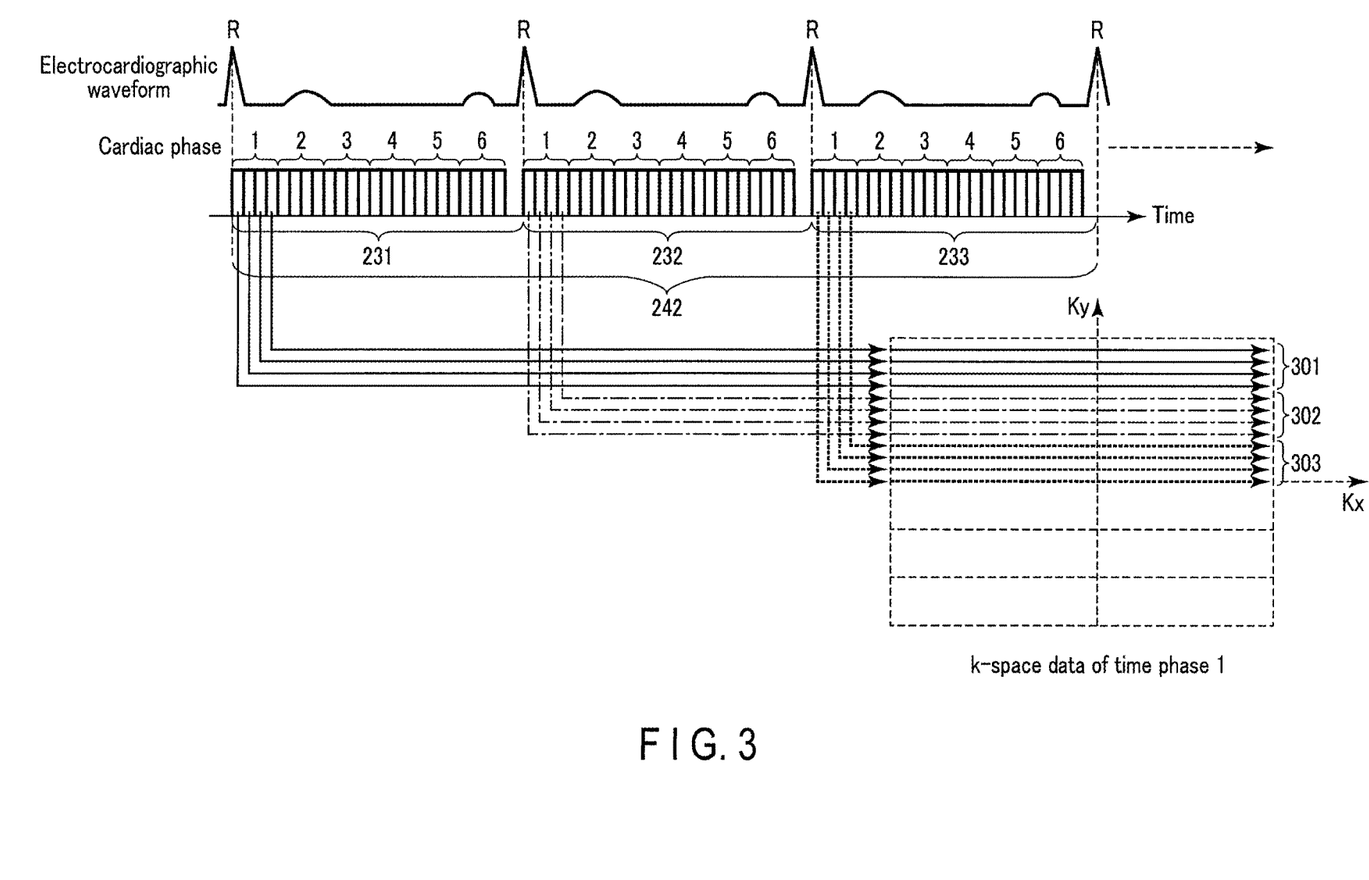
FIG. 3 relates to the embodiment, and is a view illustrating an example of a procedure of filling, in a first longitudinal magnetization recovery period, data relating to cardiac phase 1, which was acquired in cine first acquisition, cine second acquisition and cine third acquisition, into a two-dimensional k-space which is segmented, and single slice multi-phase imaging.

FIG. 3 is a view illustrating an example of a procedure of filling, in the first longitudinal magnetization recovery period 242, data relating to cardiac phase 1, which was acquired in the cine first acquisition 231, cine second acquisition 232 and cine third acquisition 233, into the two-dimensional k-space which is segmented, and single slice multi-phase imaging (second imaging sequence) which is executed by the control circuitry 17. As illustrated in FIG. 3, it is assumed that the number of segments in the k-space is 6. In addition, as illustrated in FIG. 3, the number of cardiac phases of image data acquired in one cardiac cycle (heartbeat) is 6. Besides, in one cardiac phase, the encode number relating to data acquisition is 4, and the encode number in the entirety of the k-space is 6×4=24.

In the meantime, each of the number of segments and the number of cardiac phase is not limited to 6. In addition, in one cardiac phase, the phase encode number relating to data acquisition is not limited to 4. The number of segments, the number of cardiac phases, and the phase encode number in one cardiac phase can be properly adjustable to preset values in accordance with the operator's instructions via the input circuitry 16. At this time, the number of segments, the number of cardiac phases, and the phase encode number in one cardiac phase are changed in interlock with a slice thickness in accordance with the operator's instruction.

As illustrated in FIG. 3, in the first heartbeat period in the first longitudinal magnetization recovery period 242, the data processing circuitry 13 fills data of phase encode of four lines, which was acquired by the cine first acquisition 231 in the period of cardiac phase 1, along a frequency encode direction (kx) for each encode from an outside of a phase encode direction (ky) of the k-space (301 in k-space data of cardiac phase 1). In FIG. 3, the signs of the phase encode gradient field relating to the four data acquired by the cine first acquisition 231 in the cardiac phase 1 correspond to +11, +10, +9 and +8, respectively.

In the cardiac phase 1, if the data of predetermined phase encodes (four lines in the example of FIG. 3) are acquired by the cine first acquisition 231, the control circuitry 17 acquires data of the same phase encode amount (4 lines) in the cardiac phase 2, from the same second slice as the slice relating to the cine first acquisition 231. The data processing circuitry 13 uses the data, which was acquired by the cine first acquisition 231 in the cardiac phase 2, for image reconstruction of the cardiac phase 2 which follows the cardiac phase 1. The control circuitry 17 repeatedly acquires data of other cardiac phases following the cardiac phase 2, for a predetermined number of cardiac phases (six cardiac phases in the example of FIG. 3), or until the next R wave is detected.

The data processing circuitry 13 fills data, which was acquired by the cine second acquisition 232 in the cardiac phase 1 in the next heartbeat, into four lines in the k-space, which are located on the inside of the filling area in the k-space of the data acquired by the cine first acquisition 231 in the cardiac phase 1 (302 in the k-space data of cardiac phase 1). The signs of the phase encode gradient field relating to the four data acquired by the cine second acquisition 232 in the cardiac phase 1 correspond to +7, +6, +5 and +4, respectively.

Furthermore, in the cardiac phase 1 in the next heartbeat, like the data acquisition by the cine first acquisition 231 and cine second acquisition 232, the control circuitry 17 acquires data relating to phase encode lines in the vicinity of the center of the k-space. The data processing circuitry 13 fills data corresponding to four encode lines, which was acquired by the cine third acquisition 233 in the cardiac phase 1, into four lines located on the inside of the filling area in the k-space of the data acquired by the cine second acquisition 232 in the cardiac phase 1, that is, into four lines located on the plus (+) side of the vicinity of the center of the k-space (303 in the k-space data of cardiac phase 1). The signs of the phase encode gradient field relating to the four data acquired by the cine third acquisition 233 in the cardiac phase 1 correspond to +3, +2, +1 and 0, respectively.

In the example of the filling of data into the k-space of the cardiac phase 1 in FIG. 3, the control circuitry 17 acquires half the data amount that is necessary for image reconstruction of plural cardiac phases (cardiac phases 1 to 6) of the second slice in the three heartbeats relating to the cine first acquisition 231, cine second acquisition 232 and cine third acquisition 233, that is, the data that occupies half the k-space in each of the plural cardiac phases.

Figure 4:
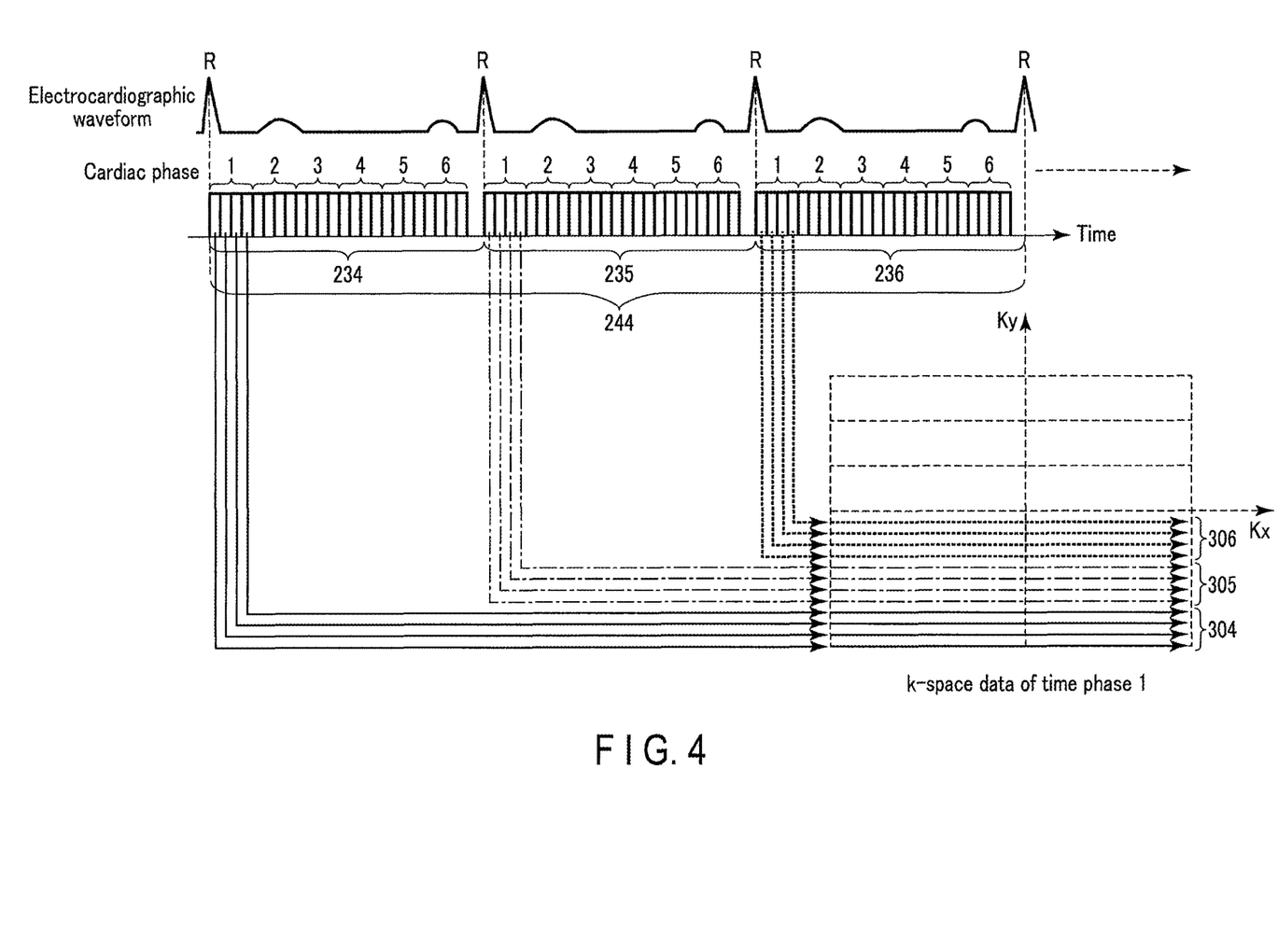
FIG. 4 relates to the embodiment, and is a view illustrating an example of a procedure of filling, in a second longitudinal magnetization recovery period, data relating to cardiac phase 1, which was acquired in cine fourth acquisition, cine fifth acquisition and cine sixth acquisition, into the two-dimensional k-space which is segmented, and single slice multi-phase imaging.

FIG. 4 is a view illustrating an example of a procedure of filling, in the second longitudinal magnetization recovery period 244, data relating to cardiac phase 1, which was acquired in the cine fourth acquisition 234, cine fifth acquisition 235 and cine sixth acquisition 236, into the two-dimensional k-space which is segmented, and single slice multi-phase imaging (second imaging sequence) which is executed by the control circuitry 17.

As illustrated in FIG. 4, the data processing circuitry 13 fills data of phase encode of four lines, which was acquired by the cine fourth acquisition 234 in the cardiac phase 1 of the first heartbeat in the second longitudinal magnetization recovery period 244, along the frequency encode direction (kx) for each encode into an area on the side opposite to the filling area in the k-space of the data acquired by the cine first acquisition 231 in the cardiac phase 1 (304 in the k-space data of cardiac phase 1). In FIG. 4, the signs of the phase encode gradient field relating to the four data acquired by the cine fourth acquisition 234 in the cardiac phase 1 correspond to −12, −11, −10 and −9, respectively.

Next, in the cardiac phase 1 of each of the following two heartbeats, the control circuitry 17 acquires data for filling into the areas on the inside of the area 304 in the k-space, successively by the cine fifth acquisition 235 and cine sixth acquisition 236. The data processing circuitry 13 fills the data, which was successively acquired by the cine fifth acquisition 235 and cine sixth acquisition 236 in the cardiac phase 1, into an area 305 and an area 306 on the inside of the area 304 in the k-space.

As described above, in the recovery periods of T1 relaxation (first and second longitudinal magnetization recovery periods) in the acquisition of the distribution of the T1 relaxation time (T1 measurement first to eleventh acquisitions), the control circuitry 17 executes the acquisitions (cine first to sixth acquisitions) which are of a kind different from the acquisition of the distribution of the T1 relaxation time. This different kind of acquisition (cine first to sixth acquisitions) is acquisition that is non-influential on the T1 relaxation in the first slice. At this time, the data processing circuitry 13 reconstructs a T1 map as a first image by the acquisition of the distribution of the T1 relaxation time, and reconstructs, as a cine image, a second image, which is of the different kind from the first image, by the different kind of acquisition.

In the above description of FIG. 3 and FIG. 4, in the first heartbeat in each of the first longitudinal magnetization recovery period 242 and second longitudinal magnetization recovery period 244, high-frequency-side data of the k-space are acquired by the cine first acquisition 231 and cine fourth acquisition 234, and, in the last heartbeat, low-frequency-side data of the k-space are acquired by the cine third acquisition 233 and cine sixth acquisition 236. The reason for this is that, in the first longitudinal magnetization recovery period 242 and second longitudinal magnetization recovery period 244, the magnetization is not in the completely recovered state, and thus the acquisition of low-frequency components, which influence the image contrast, is allocated as much as possible to the latter part of the longitudinal magnetization recovery period.

In the meantime, the order of application of the phase encode gradient field relating to the order of data acquisition in the first longitudinal magnetization recovery period 242 and second longitudinal magnetization recovery period 244, that is, the order of filling of acquired data into the k-space, is not limited to the above-described order. In addition, in the plural cine acquisitions in the first longitudinal magnetization recovery period 242 and second longitudinal magnetization recovery period 244, the number of phase encodes can be reduced by a combination with a reconstruction method utilizing parallel imaging or complex conjugate of data. In this case, the number of cardiac phases can be increased, or the spatial resolution can be enhanced.

Figure 5:
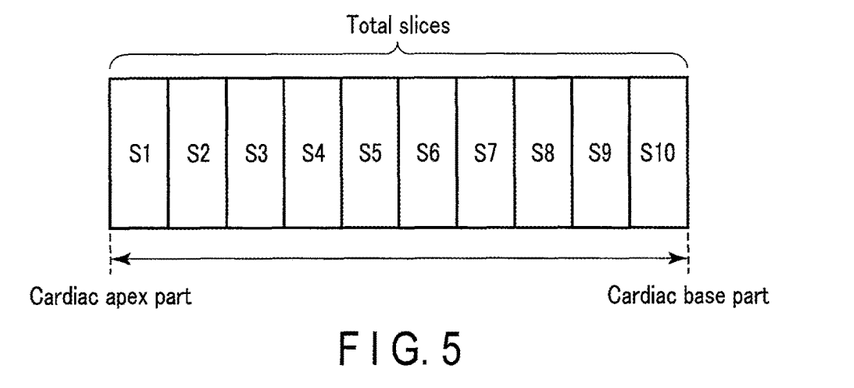
FIG. 5 relates to the embodiment, and is a view illustrating an example of the number of slices, which are necessary for obtaining a T1 map which covers the heart that is an imaging target region.

In the present embodiment, in order to obtain a T1 map which covers the entirety of the heart, the above-described imaging protocol (first imaging sequence) is repeated for the number of necessary slices. FIG. 5 is a view illustrating an example of the number of slices, which are necessary for obtaining the T1 map which covers the entirety of the heart. Each of the slices illustrated in FIG. 5 corresponds to, for example, a short-axis cross section of the heart.

Figure 6:
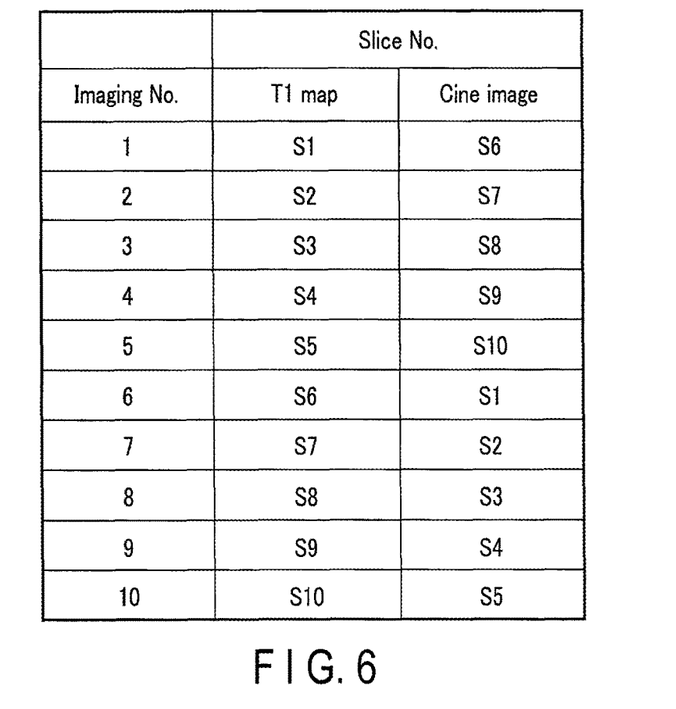
FIG. 6 relates to the embodiment, and is a view illustrating, together with imaging numbers which indicate the order of imaging, slice numbers at which a first imaging sequence for acquiring data relating to a T1 map is executed, and slice numbers at which a second imaging sequence for acquiring data relating to a cine image is executed.

As illustrated in FIG. 5, it is assumed that the number of slices, which are necessary for obtaining the T1 map which covers the entirety of the heart, is ten, and the ten slices correspond to slice numbers S1 to S10 from a cardiac apex part to a cardiac base part. FIG. 6 is a view illustrating, together with imaging numbers which indicate the order of imaging, slice numbers at which the first imaging sequence for acquiring data relating to the T1 map is executed, and slice numbers at which the second imaging sequence for acquiring data relating to the cine image is executed.

At this time, as illustrated in FIG. 5 and FIG. 6, in the imaging protocol in the first imaging, the control circuitry 17 acquires data relating to the T1 map in the slice S1, and acquires data relating to the cine image in the slice S6. Subsequently, in the data acquisition by the second imaging to the tenth imaging, the control circuitry 17 executes acquisition of data relating to the T1 map (hereinafter referred to as "T1 imaging") and acquisition of data relating to the cine image (hereinafter referred to as "cine imaging"), with respect to all slices from the slice S1 to slice S10 by combinations of slice positions as illustrated in FIG. 6. Thereby, in the case in which the imaging target region is the heart as illustrated in FIG. 5, the acquisition of data relating to the T1 map and cine image is completed with respect to all ten slices from the cardiac apex part to cardiac base part.

The combination between the slice number, at which the T1 imaging is executed, and the slice number, at which the cine imaging is executed, with respect to each of the imaging numbers, as illustrated in FIG. 6, is an example of the case in which the slice position of a first slice relating to the T1 imaging and the slice position of a second slice relating to the cine imaging are distanced as much as possible in order to prevent an interference with the slice relating to the T1 imaging by the data acquisition of the cine imaging. As illustrated in FIG. 5 and FIG. 6, the first slice relating to the T1 imaging and the second slice relating to the cine imaging are parallel to each other, and are spaced apart at a predetermined interval (e.g. 5 cm if one slice is 1 cm).

In the meantime, the combination between the position of the slice at which T1 imaging is executed and the position of the slice at which cine imaging is executed is not limited to the combination illustrated in FIG. 6. In addition, in the T1 imaging and cine imaging over the entirety of the heart, it is not always necessary that the slice thickness, slice interval and slice position be identical. Incidentally, the second acquisition is not limited to the cine imaging, if an imaging method which does not involve non-selective pre-pulses is adopted.

According to the above-described configuration, the following advantageous effects can be obtained.

According to the magnetic resonance imaging apparatus 100 of the present embodiment, the acquisition of the distribution of the T1 relaxation time, the target of which is the first slice, and the acquisition, which is different in kind from the acquisition of the distribution of the T1 relaxation time and the target of which is the second slice, can be executed by a single protocol. Specifically, in the longitudinal magnetization recovery period in the acquisition of the T1 relaxation time distribution, the magnetic resonance imaging apparatus 100 can acquire data of plural cardiac phases from the slice (second slice) which is different from the slice (first slice) relating to the T1 measurement, by the high-speed imaging method such as the SSFP, FFE or EPI (echo planar imaging) sequence which is segmented in accordance with ECG gating.

Thereby, according to the magnetic resonance imaging apparatus 100, the cine image of the second slice, which is different from the first slice, can be obtained in the wait time (longitudinal magnetization recovery period) of imaging relating to the acquisition of the T1 map. Thus, when the T1 map and cine image are acquired over plural slices in the evaluation of the entirety of the cardiac muscle, the total examination time can be shortened. Specifically, according to the present embodiment, since there is no need to separately execute the imaging relating to the T1 map and the cine imaging, a long period of breath-holds of, for example, 20 times is needless.

Specifically, according to the magnetic resonance imaging apparatus 100, the T1 map and cine image, which the operator desires, can be obtained with half the time in the conventional art, for example, with breadth-holds of about ten times. Thus, the examination time is shortened, and the enhancement of examination efficiency, which is the object of the embodiment, can be achieved. In other words, if consideration is given to the situation in which T1 map imaging is newly added to the standard protocol of the examination of the heart, the T1 map imaging can be completed while the cine imaging is being executed, according to the magnetic resonance imaging apparatus 100.

(First Modification)

A first modification of the embodiment differs from the embodiment in the following point. The data acquisition in the second slice is completed in one longitudinal magnetization recovery period (a period corresponding to three heartbeats) by either means of enhancing the speed increase rate of parallel imaging at the time of acquisition of cine imaging, or means of decreasing the spatial resolution or the number of cardiac phases. In the next longitudinal magnetization recovery period, cine imaging is executed in a third slice which neither overlaps nor crosses a region of interest of the first slice, and which neither overlaps nor crosses the second slice. In the meantime, the third slice may be a slice which does not overlap the region of interest of the first slice or the second slice, and is parallel to the region of interest of the first slice and the second slice.

Figure 7:
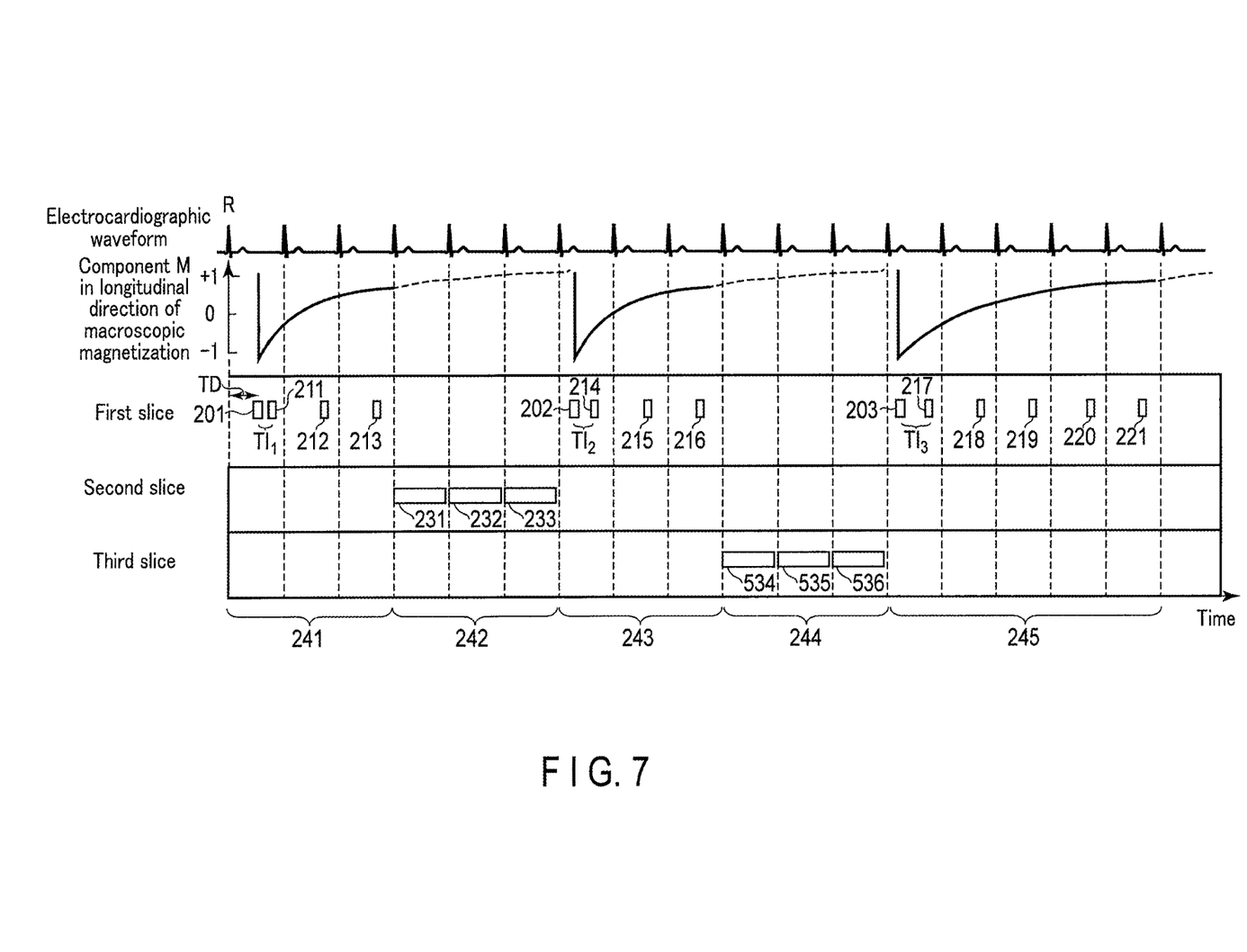
FIG. 7 is a view illustrating an example of an imaging protocol according to a first modification of the embodiment.

FIG. 7 is a view illustrating an example of an imaging protocol according to the present modification. As illustrated in FIG. 7, the imaging protocol includes first acquisition which is executed in a first slice, second acquisition which is executed in a second slice, and acquisition (hereinafter referred to as "third acquisition") which is different in kind from the acquisition of the distribution of the T1 relaxation time and is executed in a third slice. Specifically, the imaging protocol illustrated in FIG. 7 is a single protocol which executes the first acquisition, second acquisition and third acquisition. A third imaging sequence relating to the third acquisition and a second imaging sequence relating to the second acquisition are sequences with different slice positions of acquisition targets, and these sequences adopt the same imaging method. Incidentally, different imaging methods may be adopted in the third imaging sequence and second imaging sequence.

As illustrated in FIG. 7, the control circuitry 17 completes the data acquisition relating to the second slice, with the three heartbeats in the first longitudinal magnetization recovery period 242. The control circuitry 17 executes cine imaging (534, 535, 536) for the third slice that is different from the first slice and second slice, with respect to each of the three heartbeats in the second longitudinal magnetization recovery period (wait time for next relaxation time) 244.

Figure 8:
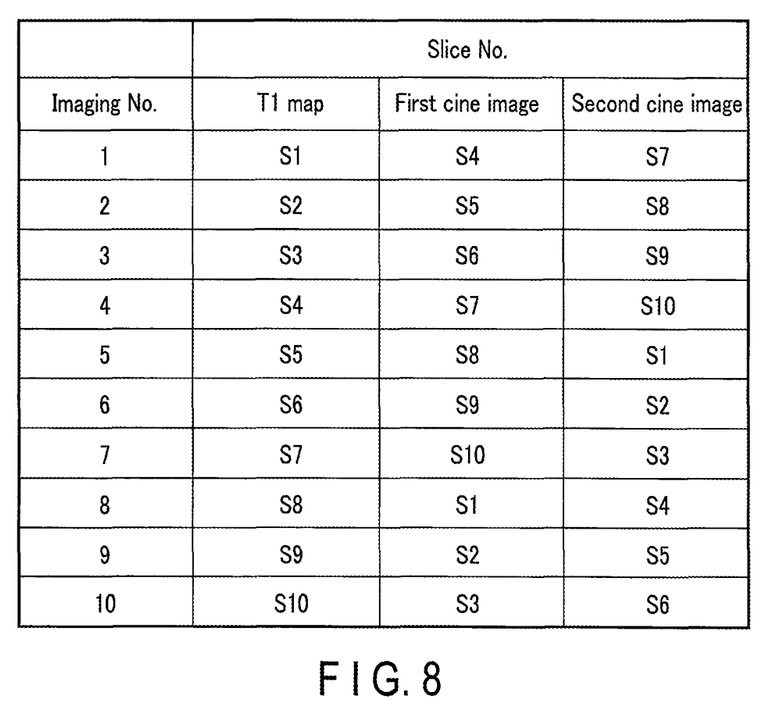
FIG. 8 relates to the first modification of the embodiment, and is a view illustrating, together with imaging numbers which indicate the order of imaging, slice numbers at which a first imaging sequence for acquiring data relating to a T1 map is executed, and slice numbers at which a second imaging sequence and third imaging sequence for acquiring data relating to cine images are executed.

FIG. 8 is a view illustrating, together with imaging numbers which indicate the order of imaging, slice numbers at which the first imaging sequence for acquiring data relating to a T1 map is executed, and slice numbers at which the second imaging sequence and third imaging sequence for acquiring data relating to cine images is executed.

At this time, as illustrated in FIG. 8, in the imaging protocol in the first imaging, the control circuitry 17 acquires data relating to the T1 map in the slice S1, acquires data relating to a first cine image in the slice S4, and acquires data relating to a second cine image in the slice S7. Subsequently, in the data acquisition by the second imaging to the tenth imaging, the control circuitry 17 executes acquisition of data relating to the T1 map (T1 imaging), acquisition of data relating to the first cine image (hereinafter referred to as "first cine imaging") and acquisition of data relating to the second cine image (hereinafter "second cine imaging"), with respect to all slices from the slice S1 to slice S10 by combinations of slice positions as illustrated in FIG. 8.

Thereby, the acquisition of data relating to the T1 map, first cine image and second cine image is completed with respect to all ten slices from the cardiac apex part to cardiac base part. The data processing circuitry 13 reconstructs the first cine image, based on the data acquired by the first cine imaging. The data processing circuitry 13 reconstructs the second cine image, based on the data acquired by the second cine imaging.

In the meantime, the combination between the position of the slice at which the T1 imaging is executed, and the positions of the slices at which the first cine imaging and second cine imaging are executed is not limited to the combination illustrated in FIG. 8. In addition, in the T1 imaging, first cine imaging and second cine imaging over the entirety of the heart, it is not always necessary that the slice thickness, slice interval and slice position be identical.

According to the above-described configuration, the following advantageous effects can be obtained in addition to the advantageous effects of the present embodiment.

According to the magnetic resonance imaging apparatus 100 of the present modification, the number of slices of cine imaging becomes double, relative to one T1 map. Thus, when the number of slices of the T1 map may be small, compared to the number of slices of the cine imaging, a slice coverage (slice range) of cine imaging can be secured. Additionally, according to the present modification, the slice thickness of cine imaging can be reduced to half the slice thickness of the T1 map, and the resolution of in the slice direction of cine imaging can be enhanced. Besides, as an application example of this modification, the number of segments may be reduced, or the number of cardiac phases may be reduced, and thereby the slice thickness of cine imaging can be increased.

(Second Modification)

A second modification of the embodiment differs from the embodiment in the following point. The data acquisition in the second slice is completed in one longitudinal magnetization recovery period (a period corresponding to three heartbeats) by either means of enhancing the speed increase rate of parallel imaging at the time of acquisition of cine imaging, or means of decreasing the spatial resolution or the number of cardiac phases. In the next longitudinal magnetization recovery period, imaging, which is different from the cine imaging and T1 imaging, is executed in the second slice.

Figure 9:
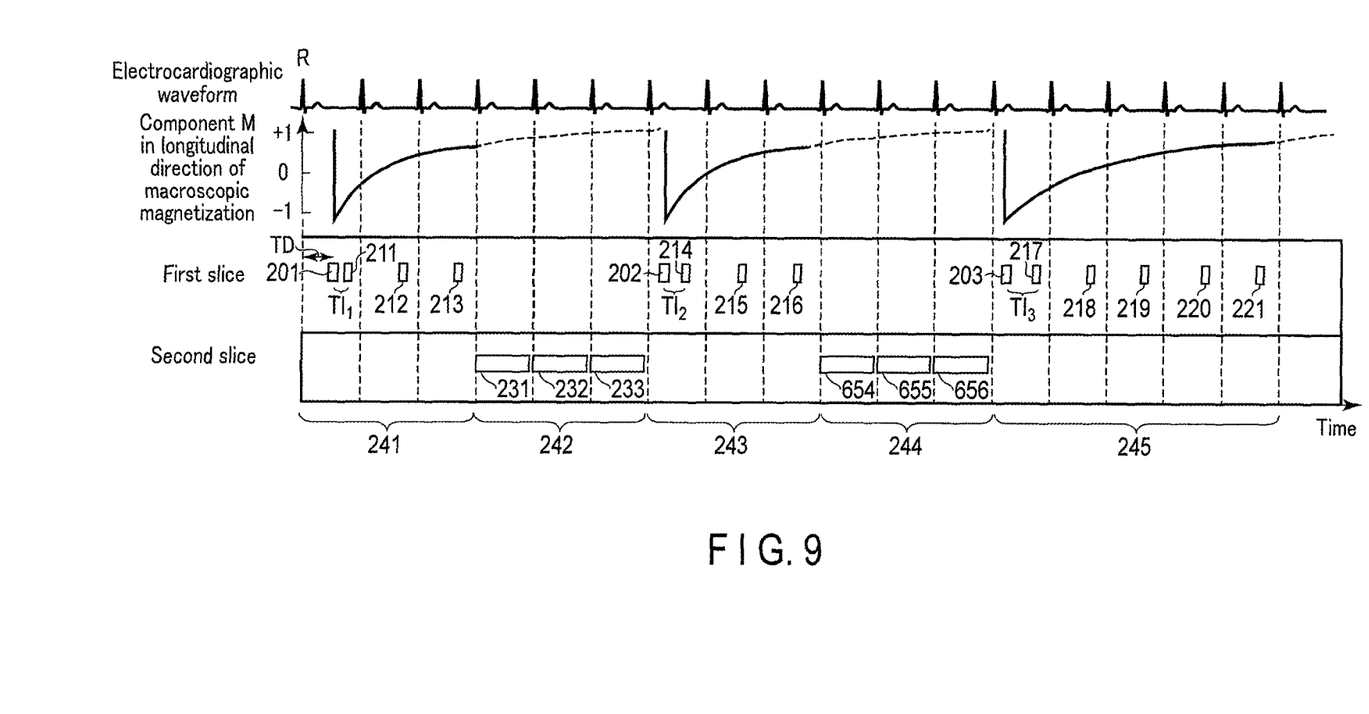
FIG. 9 is a view illustrating an example of an imaging protocol according to a second modification of the embodiment.

FIG. 9 is a view illustrating an example of an imaging protocol according to the present modification. As illustrated in FIG. 9, the imaging protocol includes first acquisition which is executed in a first slice, second acquisition which is executed in a second slice, and acquisition (hereinafter referred to as "third acquisition") which is different in kind from the acquisition of the T1 map and the acquisition of the cine image and is executed in the second slice. Specifically, the imaging protocol illustrated in FIG. 9 is a single protocol which executes the first acquisition, second acquisition and third acquisition. A third imaging sequence relating to the third acquisition is different from a first imaging sequence relating to the first acquisition and a second imaging sequence relating to the second acquisition.

As illustrated in FIG. 9, the control circuitry 17 completes the data acquisition relating to the second slice, with the three heartbeats in the first longitudinal magnetization recovery period 242. The control circuitry 17 executes data acquisition (634, 635, 636) of flow velocity measurement, by the third imaging sequence for the second slice, with respect to each of the three heartbeats in the second longitudinal magnetization recovery period (wait time for next relaxation time) 244. Based on the data of flow velocity measurement obtained by the third acquisition, the data processing circuitry 13 reconstructs a flow velocity image showing the flow velocity of a fluid in the second slice. The third imaging sequence is, for example, an imaging sequence by a phase contrast method. Incidentally, the third imaging sequence is not limited to the phase contrast method.

According to the imaging protocol illustrated in FIG. 9, the data processing circuitry 13 can obtain, by a single breadth-hold, the T1 map relating to the first slice and the cine image and flow velocity image relating to the second slice. In the meantime, the image acquired in the second longitudinal magnetization recovery period 244 is not limited to the flow velocity image by the phase contrast method, and may be, for example, other kind of image such as a distribution image of T2* relaxation time (hereinafter referred to "T2* map") by a multi-echo gradient echo method. At this time, the third imaging sequence corresponds to an imaging sequence for data acquisition relating to the T2* map by the multi-echo gradient echo method. The T2* map is used for evaluation of iron deposition in the cardiac muscle.

According to the above-described configuration, the following advantageous effects can be obtained in addition to the advantageous effects of the present embodiment.

According to the magnetic resonance imaging apparatus 100 of the present modification, data acquisitions for obtaining different images for the second slice can be executed in the first longitudinal magnetization recovery period 242 and second longitudinal magnetization recovery period 244 in the single imaging protocol. Thereby, according to the present modification, in the acquisition of the data relating to the T1 map, the data relating to the image (flow velocity image, T2*map or the like), which is different from the cine image, and to the cine image can be acquired by a single breadth-hold. Therefore, the examination efficiency can be enhanced.

The present embodiment, the first modification and the second modification have been described above. The present embodiment, first modification and second modification are not limited to the above descriptions, and can be implemented by being modified as needed. For example, in the present embodiment, the cine image of the second slice is acquired during the wait time of T1 relaxation. However, aside from the cine image, it is possible to execute imaging relating to a flow velocity image by the phase contrast method, or imaging relating to the T2* relaxation time map by the multi-echo gradient echo method. At this time, the imaging sequences relating to these imagings are incorporated in the above-described imaging protocol. The storage circuitry 14 may store, as different presets, the imaging protocols described in the above various modifications.

Additionally, although it was described that the balanced steady-state free precession (SSFP) type sequence is used for the T1 map and cine imaging, other pulse sequences, such as the gradient field echo method and echo planar imaging method, may be used. Additionally, although the cine imaging illustrated in FIG. 3 and FIG. 4 was described as being executed by Cartesian sampling, acquisition may be executed by a non-Cartesian trajectory such as a radial or spiral trajectory.

The imaging procedures by the imaging protocols illustrated in the above-described embodiment, first modification and second modification can be executed based on a program that is software. The imaging protocols described in the above embodiment, etc., are stored as a program, which is executable by the computer system 10 in the magnetic resonance imaging apparatus 100, in a storage medium such as a magnetic disk (e.g. a flexible disk, a hard disk), an optical disk (e.g. a CD-ROM, a CD-R, a CD-RW, a DVD-ROM, a DVD±R, a DVD±RW), a semiconductor memory, or the like. The storage form of this storage medium may be any form as long as the storage medium is readable by a computer or an embedded system.

At this time, if the computer system 10 reads in the program from this storage medium and executes, based on this program, the instructions described in the program by the CPU, the same operation as that of the magnetic resonance imaging apparatus 100 of the above embodiment can be realized. Needless to say, when the computer system 10 acquires or reads in the program, the computer system 10 may acquire or read in the program via a network.

Additionally, the storage medium is not limited to a medium which is independent from the computer or embedded system, and includes a storage medium which stores or temporarily stores, by download, a program which is transmitted over a LAN (Local Area Network) or the Internet.

Additionally, the number of storage media is not limited to one. The configuration of the storage media in the embodiment includes such a case that the process in the above-described embodiment is executed from a plurality of media, and the configuration of the media may be any configuration.

According to the above-described magnetic resonance imaging apparatus, the examination efficiency can be enhanced at a time of acquiring the distribution of the T1 relaxation time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising control circuitry configured to execute, by a single protocol, acquisition of a distribution of a T1 relaxation time with a first slice as a target, and acquisition of a different kind from the distribution of the T1 relaxation time with a second slice as a target which neither overlaps nor crosses a region of interest of the first slice.

2. The magnetic resonance imaging apparatus according to claim 1, wherein the control circuitry is configured to execute the acquisition of the different kind with the second slice as the target, in a recovery period of longitudinal magnetization in the acquisition of the distribution of the T1 relaxation time.

3. The magnetic resonance imaging apparatus according to claim 1, wherein the acquisition of the different kind is acquisition which does not influence recovery of longitudinal magnetization in the first slice.

4. The magnetic resonance imaging apparatus according to claim 1, further comprising data processing circuitry configured to reconstruct a first image by the acquisition of the distribution of the T1 relaxation time, and to reconstruct a second image of a different kind from the first image by the acquisition of the different kind,
wherein the second image is a cine image in the second slice.

5. The magnetic resonance imaging apparatus according to claim 1, further comprising data processing circuitry configured to reconstruct a first image by the acquisition of the distribution of the T1 relaxation time, and to reconstruct a second image of a different kind from the first image by the acquisition of the different kind,
wherein the second image is a flow velocity image indicative of a flow velocity of a fluid in the second slice.

6. The magnetic resonance imaging apparatus according to claim 5, wherein the acquisition of the different kind is acquisition using a phase contrast method.

7. The magnetic resonance imaging apparatus according to claim 1, further comprising data processing circuitry configured to reconstruct a first image by the acquisition of the distribution of the T1 relaxation time, and to reconstruct a second image of a different kind from the first image by the acquisition of the different kind,
wherein the second image is an image indicative of a distribution of T2* relaxation time in the second slice.

8. The magnetic resonance imaging apparatus according to claim 1, wherein the protocol includes an imaging sequence corresponding to a MOLLI (Modified Look-Locker Inversion Recovery) method as the acquisition of the distribution of the T1 relaxation time.

9. The magnetic resonance imaging apparatus according to claim 1, wherein the first slice and the second slice are parallel to each other and are spaced apart at a predetermined interval.

10. The magnetic resonance imaging apparatus according to claim 1, wherein the first slice and the second slice are slices relating to the heart as a target region of imaging.

11. The magnetic resonance imaging apparatus according to claim 1, wherein the control circuitry is configured to execute, by the single protocol,
acquisition of the distribution of the T1 relaxation time,
acquisition of the different kind from the distribution of the T1 relaxation time with the second slice as a target in one recovery period of two recovery periods relating to recovery of longitudinal magnetization in the acquisition of the distribution of the T1 relaxation time, and
acquisition of the different kind from the distribution of the T1 relaxation time with a third slice as a target in the other recovery period of the two recovery periods, the third slice being a slice which neither overlaps nor crosses a region of interest of the first slice, and which neither overlaps nor crosses the second slice.

12. The magnetic resonance imaging apparatus according to claim 1, wherein the control circuitry is configured to execute, by the single protocol,
acquisition of the distribution of the T1 relaxation time,
acquisition of the different kind from the distribution of the T1 relaxation time with the second slice as a target in one recovery period of two recovery periods relating to recovery of longitudinal magnetization in the acquisition of the distribution of the T1 relaxation time, and
acquisition of a kind different from the distribution of the T1 relaxation time and from the different kind, with a third slice as a target, in the other recovery period of the two recovery periods, the third slice being a slice which neither overlaps nor crosses a region of interest of the first slice, and which neither overlaps nor crosses the second slice.

13. The magnetic resonance imaging apparatus according to claim 1, wherein the control circuitry is configured to apply a non-space-selective inversion recovery pulse to a transmission RF coil in the acquisition of the distribution of the T1 relaxation time.

* * * * *